United States Patent [19]

Gutierrez et al.

[11] Patent Number: 4,477,294

[45] Date of Patent: Oct. 16, 1984

[54] METHOD OF FORMING GAAS ON $AL_yGA_{1-y}$ AS TRANSMISSION MODE PHOTOCATHODEHODE

[75] Inventors: William A. Gutierrez; Herbert L. Wilson, both of Woodbridge, Va.

[73] Assignee: The United States of America as represented by the Secretary of the Army, Washington, D.C.

[21] Appl. No.: 489,632

[22] Filed: Jun. 22, 1983

Related U.S. Application Data

[62] Division of Ser. No. 260,958, May 6, 1981, abandoned.

[51] Int. Cl.[3] ........ H01L 21/208

[52] U.S. Cl. ........ 148/171; 148/172; 29/572

[58] Field of Search ........ 148/171, 172, 175; 29/572; 357/30

[56] References Cited

U.S. PATENT DOCUMENTS

| | | | |
|---|---|---|---|
| 3,901,745 | 8/1975 | Pion | 148/171 |
| 3,951,698 | 4/1976 | Wilson et al. | 148/175 X |
| 3,959,038 | 5/1976 | Gutierrez et al. | 148/175 X |
| 3,972,750 | 8/1976 | Gutierrez et al. | 148/171 |
| 3,978,428 | 8/1976 | Burnham et al. | 148/171 X |
| 3,981,755 | 9/1976 | Gowers | 148/171 |
| 4,149,308 | 4/1979 | Smith | 29/572 X |
| 4,286,373 | 9/1981 | Gutierrez et al. | 29/572 |
| 4,311,743 | 1/1982 | Kasper et al. | 428/426 X |
| 4,376,663 | 3/1983 | Wang et al. | 29/572 X |

*Primary Examiner*—G. Ozaki

*Attorney, Agent, or Firm*—Anthony T. Lane; Milton W. Lee; Max L. Harwell

[57] ABSTRACT

A method of forming a high sensitivity, large area, negative electron affinity (NEA), infrared sensitive transmission mode, GaAs on AlGaAs photocathode structure with the GaAs layer being of controlled homogeneous thickness and having a blemish-free surface. The structure is formed by using a combination of liquid and vapor phase epitaxial techniques, i.e., hybrid epitaxy.

12 Claims, 3 Drawing Figures

METHOD OF FORMING GAAS ON $AL_y GA_{1-y}$ AS TRANSMISSION MODE PHOTOCATHODEHODE

The invention described herein may be manufactures, used, and licensed by the U.S. Government for governmental purposes without the payment of any royalties thereon.

This application is a division of application Ser. No. 260,958, filed May 6, 1981, and now abandoned.

BACKGROUND OF THE INVENTION

1. Field of the Invention

The present invention relates to methods of forming photocathodes and more specifically to methods of forming high sensitivity, large area negative electron affinity (NEA) infrared sensitive transmission mode GaAs on AlGaAs photocathode structures where the GaAs serves as a NEA photoemitter and the AlGaAs serves as a passivating window substrate wherein the method of formation incorporates the best features of both liquid and vapor epitaxal methods.

2. Description of the Prior Art.

The present GaAs/AlGaAs structure, in which the GaAs serves as a NEA photoemitter and the AlGaAs serves as a passivating window substrate, exhibits a transmission mode photoresponse far exceeding that of the conventional multialkali photocathodes in both sensitivity and spectral range upon activation, in a vacuum environment, of the GaAs NEA photoemissive layer with cesium and oxygen. This particular photocathode structure shows improved sensitivity over structures where the GaAs is epitaxially grown on either single crystal $GaAs_xP_{1-x}$ or single crystal insulating materials like sapphire or spinel because the AlGaAs layer matches the GaAs more closely in lattice parameter and thermal expansion coefficient leading to a higher quality GaAs emitting layer. In addition, because of the "matched" condition, the AlGaAs layer can be made to passivate GaAs by properly doping it p-type. This reduces the surface recombination velocity at the GaAs-AlGaAs interface by bending the energy bands upwards which leads to significantly improved transmission mode photosensitivity. An additional feature of using AlGaAs as a matching layer is that the spectral window range can be made quite large which is desirable for broadband operation. Although this structure exhibits outstanding transmission mode sensitivity, its use in imaging devices is currently not practical because of gross non-uniformities and defects in the surface of the GaAs photoemitter layer. These blemishes have deleterious effects on the image quality. In addition, the lack of thickness control in growing the GaAs layer, which has a significant bearing on reproducing the photocathode response, makes this structure unsuitable for volume production. The surface defects and non-uniformities, as well as the lack of thickness control, arise because of the present method of fabrication. Currently, high sensitivity GaAs/AlGaAs photocathodes are fabricated entirely by liquid epitaxial techniques. This means that both the GaAs emitter layer and the AlGaAs window layer are liquid epitaxially grown on a suitable seed crystal like GaAs or GaP. Defects and non-uniformities are present in the grown layers because of the difficulty in controlling the onset of nucleation and the termination of growth over large areas in a liquid epitaxial process. Of particular difficulty is the controlled heteroepitaxial nucleation and growth of layers less than two to three microns thick which is the required thickness range for the GaAs layer. The reproducible blemish free growth of the GaAs photoemitting layer by liquid methods is therefore a major barrier problem to the production of high image quality and high sensitivity GaAs/AlGaAs transmission mode photocathodes.

SUMMARY OF THE INVENTION

The present invention is comprised of a practical solution to the present difficulty in reproducibly fabricating large area, blemish free GaAs/AlGaAs transmission mode photocathodes. The method incorporates the best features of both liquid and vapor epitaxial methods.

Liquid epitaxy is best suited for thick, high quality growths of Al containing Group III-V single crystal alloys where thickness control, surface morphology, and alloy composition are not critical. Vapor phase, on the other hand, is particularly suitable for the growth of thin, high quality single crystal Group III-V alloys where thickness control and uniformity as well as surface morphology and composition are extremely critical. The present inventive method is comprised of epitaxially growing a thick AlGaAs window on a suitable high quality single crystalline, seed crystal, such as GaAs or GaP, by liquid epitaxy. The thickness of this window layer is not critical. The composition is likewise not critical as long as it corresponds to a bandgap greater than 1.8 eV. Its surface is not critical since it can be mechanically-chemically polished after growth to eliminate any surface irregularities and produce a blemish free specular surface of high optical quality. The photoemitting layer of GaAs is then best grown by vapor phase technique since the layer thickness must be uniformly controlled over a large area to a thickness of approximately one micron for high transmission photosensitivity and its surface must be free of defects for high imaging quality. The GaAs layer must also be free of aluminum contamination, which is an additional problem encountered in all liquid epitaxial process, since any incorporation of aluminum would undesirably shift the threshold response toward the visible end of the spectrum.

The present method of hybrid epitaxy, i.e. using both liquid and vapor phase techniques, for fabricating large area blemish free transmission mode photocathode structures can be understood by reference to the following drawings as explained in the detached description.

DETAILED DESCRIPTION OF THE PREFERRED EMBODIMENTS

Figure 1:
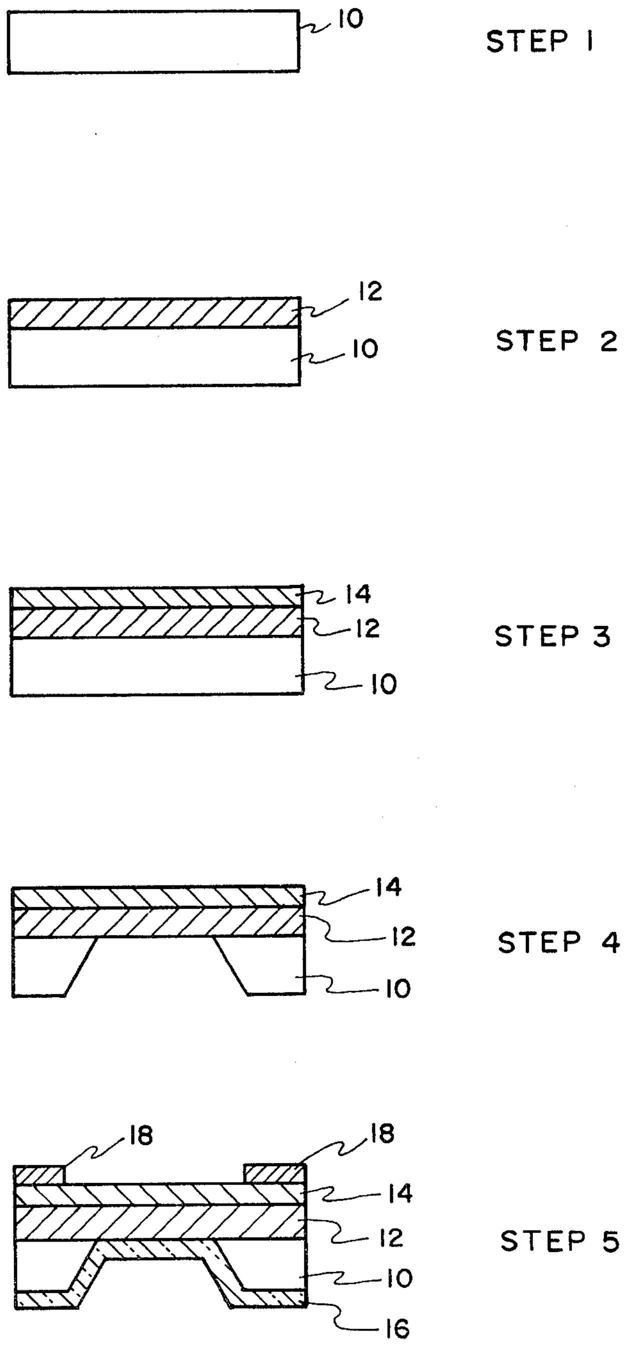
FIG. 1 shows in a step-by-step schematic a method for fabricating a ring supported GaAs/AlGaAs photocathode according to the present invention.

Refer now to FIG. 1 for an explanation of the method of fabricating a ring supported GaAs/AlGaAs photocathode of the present invention. In step 1, a (100) oriented GaAs seed crystal 10, which may be approximately 18 millimeters in diameter, is first prepared for epitaxial growth by chemically etching the growth surface in Caro's acid ($5H_2SO_4$:$1H_2O_2$:$1H_2O$) to remove any work damage introduced by previous mechanical polishing steps. In step 2, a lightly p-doped ($0.5-1.0\times10^{18}$ $cm^{-3}$) 60–80 micron thick $Al_yGa_{1-y}As$ passivating window layer 12 is grown onto the GaAs crystal 10 by liquid phase epitaxy using any of a number of conventional techniques such as, dipping, tipping or sliding. The growth step is carried out in an ulta high purity hydrogen atmosphere and the bandgap of layer 12 is adjusted to greater than 1.8 eV by adjusting the GaAl composition of the melt. Elemental zinc added to the melt in the correct proportion provides the p-type dopant. In step 3, the surface of the AlGaAs layer 12 is precision mechanically polished to remove any surface irregularities and to produce a highly specular defect free surface of high cosmetic and optical quality. The surface is then chemically etched to remove any mechanical damage and a one-micron thick p-doped, (approximately $5\times10^{18}$ $cm^{-3}$) GaAs photoemitting layer 14 is grown onto layer 12 by vapor phase epitaxy using an open tube process with HCl-Ga-$AsH_3$-$H_2$ as reagents and elemental zinc as the dopant. In the case where the aluminum content in layer 12 is high, its surface can be vapor etched in situ at about 800° C. with HCl prior to the vapor growth of layer 14 to remove any native oxide film which is likely to form on the surface of an air exposed high aluminum content AlGaAs layer. Layer 14 is grown with the growth parameters adjusted so that a specular smooth blemish free surface is obtained over the entire 18 mm diameter area of crystal 10. In step 4, a window area is produced by chemically removing seed crystal 10 from the desired active region while leaving a portion of crystal 10 as a support ring. In step 5, an appropriate antireflection coating 16, such as, silicon oxide ($SiO_2$) or silicon-nitride ($Si_3N_4$) or some suitable multilayer composite may be applied to the back of layer 12 to reduce the amount of reflected light from the photon receiving side of the structure. Finally, an appropriate contact ring 18, made of a material such as gold or indium, may be applied to the outer periphery of layer 14 so that electrical contact can be made to the photocathode from some bias supply (not shown). It should be noted that when a photocathode is formed according to the step-by-step process described in the example illustrated by FIG. 1 and the surface of the GaAs layer is activated to a state of negative electron affinity by heat cleaning in vacuum and applying monolayer amounts of cesium and oxygen, it exhibits high photosensitivity with good imaging properties. Its long wavelength response can be extended by adding indium into layer 14 during the vapor epitaxial growth step to form a lower bandgap $In_xGa_{1-x}AS$ ($0<x\leqq0.2$) photoemitting layer.

Figure 2:
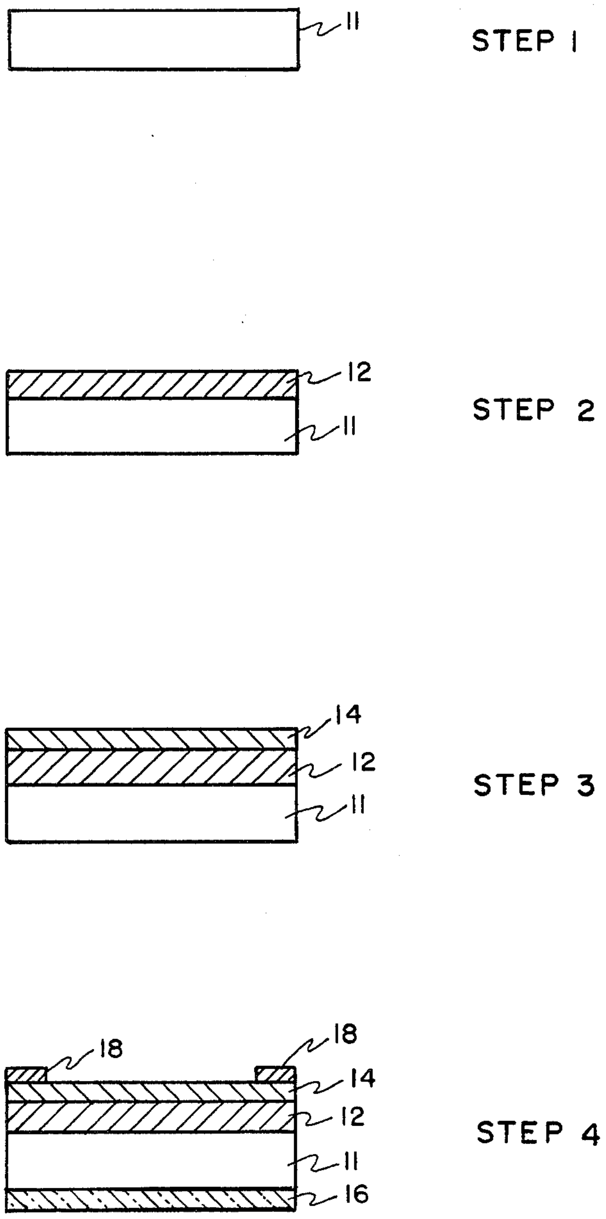
FIG. 2 shows in another step-by-step schematic a method for fabricating a GaP supported GaAs/AlGaAs photocathode.

FIG. 2 illustrates a GaP seed crystal 11 supported GaAs/AlGaAs photocathode method of preparation, or fabrication of the transmission mode photocathode.

In step 1, a (100) oriented GaP single crystal seed 11, approximately 18 mm in diameter, is prepared for epitaxial growth by chemically etching the growth surface is a hot bromine-phosphoric acid polish etch to remove mechanical damage. In step 2, a lightly p-doped $Al_yGa_{1-y}As$ ($y\geqq0.25$) passivating window layer 12 is grown onto seed 11 by liquid phase epitaxy to a thickness of 60–80 microns. The bandgap of layer 12 is adjusted to greater than 1.8 eV by adjusting the gallium-aluminum composition of the melt. Elemental zinc is used for the p-type dopant. In step 3, the surface of the AlGaAs layer 12 is precision mechanically polished to remove any surface irregularities and produce a highly specular defect free surface of high cosmetic and optical quality. The surface is then chemically etched to remove mechanical damage, introduced by the mechanical polishing step. A p-doped (approximately $5\times10^{18}$ $cm^{-3}$) GaAs photoemitting layer 14 of about 1 micron thickness is grown onto layer 12 by vapor phase epitaxy using an open tube process with HCl-Ga-$AsH_3$-$H_2$ as reagents and elemental zinc as the dopant. In some cases, as when the aluminum content in layer 12 is high, its surface can be vapor etched in situ at 800° C. with HCl prior to the growth of layer 14 to remove any native oxide film that might be present on the surface of layer 12. Layer 14 is grown with the growth parameters adjusted so that a specular smooth blemish free surface is obtained over the entire 18 mm diameter area. In step 4, an appropriate antireflection coating 16, preferably made of $SiO_2$, $Si_3N_4$, or suitable multilayer composite, is applied to the back of layer 11 to reduce the amount of reflected light from the photon receiving side of the structure. Finally, an appropriate contact ring material 18, such as gold or indium, is applied to layer 14 so that electrical contact can be made to the photocathode.

When a photocathode is constructed according to the process described in this example illustrated by FIG. 2 and the surface of the GaAs layer is activated to a state of negative electron affinity by heat cleaning in vacuum and applying monolayer amounts of cesium and oxygen, it exhibits high photosensitivity with good imaging properties. As in example 1 of FIG. 1, the long wavelength response of the cathode can be extended by incorporating indium into layer 14, during vapor epitaxial growth, to form a lower bandgap $In_xGa_{1-x}As$ ($0<x\leqq0.2$) photoemitting layer.

Figure 3:
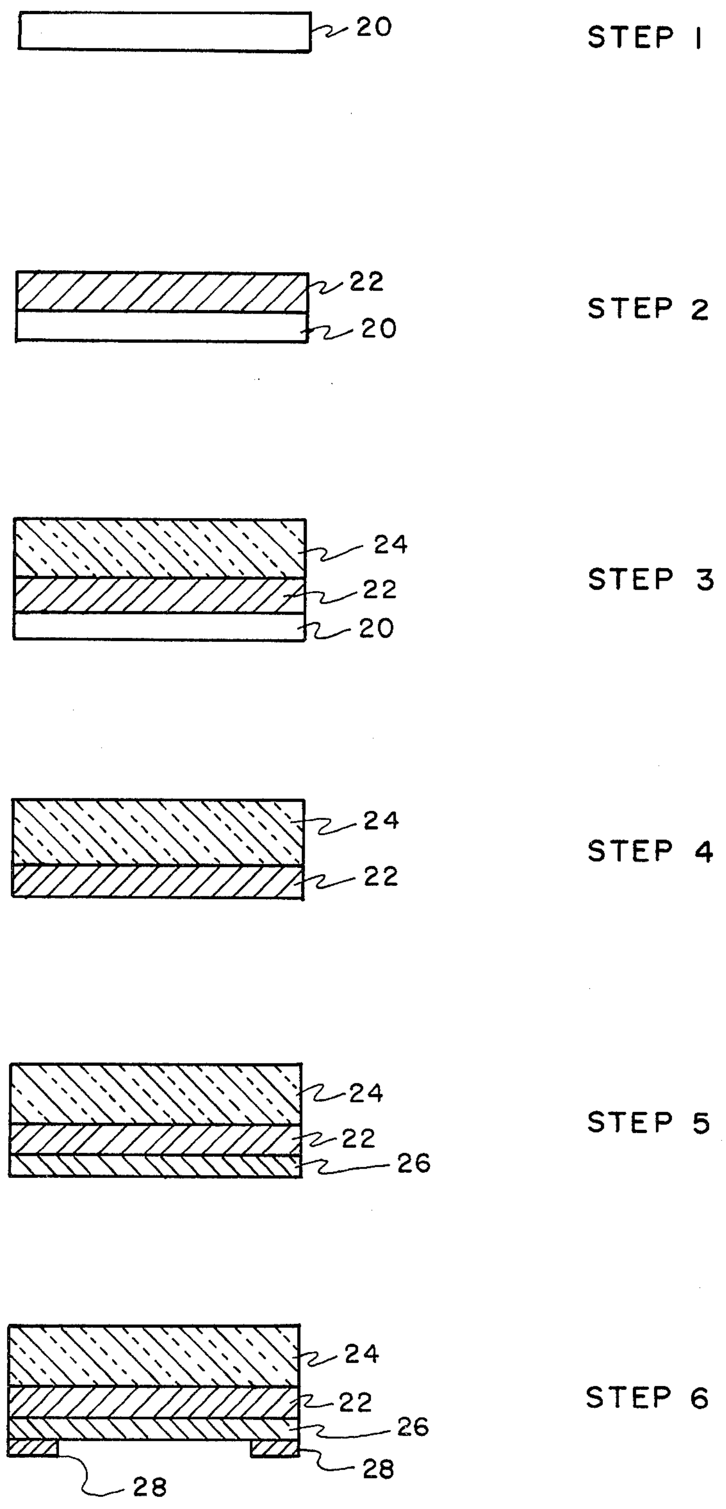
FIG. 3 shows in still another step-by-step schematic a method for fabricating a glass supported GaAs/AlGaAs photocathode.

FIG. 3 illustrates a method of fabricating a glass support GaAs-AlGaAs photocathode.

In step 1, a (100) oriented GaAs seed crystal 20, approximately 18 mm in diameter, is prepared for epitaxial growth by chemically etching the growth surface in Caro's acid ($5H_2SO_4$:$1H_2O_2$:$1H_2O$ to remove mechanical damage. In step 2, a lightly $Al_yGa_{1-y}As$ ($y\geqq0.25$) passivating window layer 22 of 60–80 microns thick is grown onto seed crystal 20 by liquid phase epitaxy. The bandgap of layer 22 is adjusted to greater than 1.8 eV by adjusting the gallium-aluminum composition of the melt. Elemental zinc is used for the p-type dopant. In step 3, the surface of layer 22 is chemically-mechanically polished in one simultaneous step to produce a plane specular surface which is free of any mechanical damage. The composite of 20 and 22 is then attached to a glass window support 24 with the surface of 22 interfacing the window support 24. The attachment can be made using either a Mallory technique, which involves ion transport under high electric field at high temperature, or by using a suitable bonding material such as a molten glass. It is desirable that window support 24 closely match layer 22 in thermal expansion coefficient up to approximately 600° C. so that no strains are introduced into the layers that 24 supports. In addition, the softening point of support 24 should be greater than 650° C. so that the structure can withstand the activation heat cleaning temperature for the photocathode layer. In step 4, seed crystal 20 is removed completely by chemical-mechanical means and the exposed surface of layer 22 is prepared for epitaxial growth by polish etching in a $5H_2SO_4$:$1H_2O_2$:$1H_2O$ etch. In step 5, a one micron thick p-doped GaAs photoemitting layer 26 is grown onto the exposed surface of layer 22 by open tube vapor phase epitaxy using HCl-Ga-$AsH_3$-$H_2$as reagents and elemental zinc as the p-type dopant. Layer 26 is grown with the growth parameters adjusted so that a specular smooth glemish free surface is obtained over the entire 18 mm diameter area. In step 6, an appropriate contact ring material 28, such as gold or indium, is applied to layer 26 so that electrical contact can be made to the photocathode.

When a photocathode is constructed according to the process described in this example and the surface of the GaAs layer is activated to a state of negative electron affinity by heat cleaning in vacuum and applying monolayer amounts of cesium and oxygen, it exhibits high photosensitivity with good imaging properties. As in the examples shown by FIGS. 1 and 2, the long wavelength response of the cathode can be extended by incorporating indium into layer 26 during vapor epitaxial growth, to form a lower bandgap $In_xGa_{1-x}As$ ($0<x\leqq 0.2$) photoemitting layer.

While certain preferred embodiments and methods have been disclosed, it will be apparent to those skilled in the art that variations in the specific details which have been described and illustrated may be resorted to without departing from the spirit and scope of the invention as defined in the appended claims.

We claim:

1. A method of reproducibly forming a large high sensitivity negative electron affinity infrared transmission mode, single crystalline GaAs on AlGaAs photocathode structure by hybrid epitaxy, the steps of forming said photocathode structure comprising:

providing and preparing a high quality single crystalline seed crystal by chemically etching a growth surface;

epitaxially growing a lightly p-doped ($0.5$–$1.0\times 10^{18}$ $cm^{-3}$) 60–80 micron thick $Al_yGa_{1-y}As$ passivating window layer on the chemically etched growth surface of said single crystalline seed crystal by liquid phase epitaxy in which the step is carried out in a ultra high purity hydrogen atmosphere where the composition corresponds to a bandgap greater than 1.8 eV by adjusing the GaAl composition of the melt wherein elemental zinc is added to the melt to provide the p-type dopant;

mechanically-chemically polising the liquid phase epitaxially grown surface of said passivating window layer to eliminate any surface irregularities and produce a blemish free specular surface of high optical quality;

growing a high transmission photosensitivity p-doped ($5\times 10^{18}$ $cm^{-3}$) GaAs photoemitting layer of controlled homogeneous thickness of about one micron onto said passivating window layer by vapor phase epitaxy technique using an open tube process with HCl-Ga-$AsH_3$-$H_2$ as reagents and elemental zinc as the p-type dopant;

activating said GaAs photoemitting layer to a state of negative electron affinity by heat cleaning in vacuum and applying monolayers of cesium and oxygen; and providing a window area and supporting said photoemitting layer-passivating window layer composite of said photocathode structure by a support means.

2. A method as set forth in claim 1, wherein the steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window layer is comprised of epitaxially growing a lightly p-doped ($0.5$–$1.0\times 10^{18}$ $cm^{-3}$) $Al_yGa_{1-y}As$ passivating window layer on the growth surface of said GaAs seed crystal, wherein said step of mechanically-chemically polishing is comprised of first precision mechanically polishing the surface of said passivating window layer to remove any surface irregularities and then chemically etching to remove any mechanical damage, and wherein said step of providing a window area is comprised of chemically removing said GaAs seed crystal from the desired active region and leaving the remainder thereof as said support means and applying an antireflection coating on the back of said GaAs photoemitting layer to reduce the amount of reflected light from the photon receiving side of said photocathode structure and applying a contact ring on the outer periphery of the front of said GaAs photoemitting layer to provide electrical contact for activating said photocathode structure.

3. A method as set forth in claim 1, wherein steps of providing and preparing said single crystalline seed crystal is comprised of providing a (100) oriented GaP seed crystal of about 18 millimeters in diameter and chemically etching the growth surface in a hot bromine-phosphoric acid polish etch to remove mechanical damage, wherein said step of liquid phase epitaxially growing a passivating window layer is comprised of epitaxially growing a lightly p-doped $Al_yGa_{1-y}As$ ($y\geqq 0.25$) passivating window layer on the growth surface of said GaP seed crystal, and wherein said step of providing a window area is comprised of applying an antireflection coating on the back of said GaAs photoemitting layer to reduce the amount of reflected light from the photon receiving side of said photocathode structure and applying a contact ring on the outer periphery of the front of said GaAs photoemitting layer to provide electrical contact for said photocathode structure.

4. A method as set forth in claim 1 wherein the steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window layer is comprised of epitaxially growing a lightly p-doped $Al_yGa_{1-y}As$ ($y\geqq 0.25$) passivating window layer on the growth surface of said GaAs seed crystal, and wherein said step of providing a window area is comprised of attaching a glass window support with the surface of said passivating window layer interfacing said glass window support and attaching thereto by using a molten glass bonded material;

removing said GaAs seed crystal completely by a chemical-mechanical means and preparing the exposed passivating window layer by polish etching the growth surface in $5H_2SO_4$:$1H_2O_2$:$1H_2O$ etch prior to said step of growing said GaAs photoemitting layer;

and wherein said step of supporting said photoemitting layer-passivating window layer composite is comprised of applying a contact ring on the outer periphery of the front of said GaAs photoemitting layer to provide electrical contact for said photocathode structure.

5. A method as set forth in claim 1 wherein said step of growing a GaAs photoemitting layer further comprises incorporating indium therein during the vapor phase epitaxy growing step to form a lower bandgap solid solution of $In_xGa_{1-x}As$ ($0<x\leqq 0.2$) which serves as said photoemitting layer and wherein the long wavelength response of said photocathode structure is extended.

6. A method as set forth in claim 5 wherein the steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window, layer is comprised of epitaxially growing a lightly p-doped ($0.5$-$1.0\times 10^{18}$ $cm^{-3}$)$Al_yGa_{1-y}As$ passivating window layer on the growth surface of said GaAs seed crystal, wherein said step of mechanically-chemically polising is comprised of first precision mechanically polishing the surface of said passivating window layer to remove any surface irregularities and then chemically etching to remove any mechanical damage, and wherein said step of providing a window area is comprised of chemically removing said GaAs seed crystal from the desired active region and leaving the remainder thereof as said support means and applying an antireflection coating on the back of said InGaAs photoemitting layer to reduce the amount of reflected light from the photon receiving side of said photocathode structure and applying a contact ring on the outer periphery of the front of said InGaAs photoemitting layer to provide electrical contact for activating said photocathode structure.

7. A method as set forth in claim 5 wherein steps of providing and preparing said single crystalline seed crystal is comprised of providing a (100) oriented GaP seed crystal of about 18 millimeters in diameter and chemically etching the growth surface in a hot bromine-phosphoric acid polish etch to remove mechanical damage, wherein said step of liquid phase epitaxially growing a passivating window layer is comprised of epitaxially growing a lightly p-doped $AlyGa_{1-y}As$ ($y\geqq 0.25$) passivating window layer on the growth surface of said GaP seed crystal, and wherein said step of providing a window area is comprised of applying an antireflection coating on the back of said InGaAs photoemitting layer to reduce the amount of reflected light from the photon receiving side of said photocathode structure and applying a contact ring on the outer periphery of the front of said InGaAs photoemitting layer to provide electrical contact for said photocathode structure.

8. A method as set forth in claim 5 wherein the steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window layer is comprised of epitaxially growing a lightly p-doped $Al_yGa_{1-y}As$($Y\geqq 0.25$) passivating window layer on the growth surface of said GaAs seed crystal, and wherein said step of providing a window area is comprised of attaching a glass window support with the surface of said passivating window layer interfacing said glass window support and attaching thereto by using a molten glass bonded material;

removing said GaAs seed crystal completely by a chemical-mechanical means and preparing the exposed passivating window layer by polish etching the growth surface in $5H_2SO_4$:$1H_2O_2$:$1H_2O$ etch prior to said step of growing said InGaAs photoemitting layer;

and wherein said step of supporting said photoemitting layer-passivating window layer composite is comprised of applying a contact ring on the outer periphery of the front of said InGaAs photoemitting layer to provide electrical contact for said photocathode structure.

9. A method as set forth in claim 5 wherein in said step of epitaxially growing a passivating window layer the Al content of the $Al_yGa_{1-y}As$ melt is high and the surface of said passivating window layer is treated by an additional step of vapor etching in situ at about 800° C. with HCl prior to the step of growing said InGaAs photoemitting layer to remove any native oxide film formed on the surface of said passivating window layer when exposed to air.

10. A method as set forth in claim 9 wherein the steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window layer is comprised of epitaxially growing a lightly p-doped ($0.5$-$1.0\times 10^{18}$ $cm^{-3}$)$Al_yGa_{1-y}As$ passivating window layer on the growth surface of said GaAs seed crystal, wherein said step of mechanically-chemically polishing is comprised of first precision mechanically polishing the surface of said passivating window layer to remove any surface irregularities and then chemically etching to remove any mechanical damage, and wherein said step of providing a window area is comprised of chemically removing said GaAs seed crystal from the desired active region and leaving the remainder thereof as said support means and applying an antireflection coating on the back of said InGaAs photoemitting layer to reduce the amount of reflected light from the photon receiving side of said photocathode structure and applying a contact ring on the outer periphery of the front of said InGaAs photoemitting layer to provide electrical contact for activating said photocathode structure.

11. A method as set forth in claim 9 wherein steps of providing and preparing said single crystalline seed crystal is comprised of providing a (100) oriented GaP seed crystal of about 18 millimeters in diameter and chemically etching the growth surface in a hot bromine-phosphoric acid polish etch to remove mechanical damage, wherein said step of liquid phase epitaxially growing a passivating window layer is comprised of epitaxially growing a lightly p-doped $Al_yGa_{1-y}As$ ($y\geqq 0.25$) passivating window layer on the growth surface of said GaP seed crystal, and wherein said step of providing a window area is comprised of applying an antireflection coating on the back of said InGaAs photoemitting layer to reduce the amount of reflected light from the photon receiving side of said photocathode structure and applying a contact ring on the outer priphery of the front of said InGaAs photoemitting layer to provide electrical contact for said photocathode structure.

12. A method as set fort in claim 9 wherein said steps of providing and preparing said single crystalline seed crystal is comprised of providing a (100) oriented GaAs seed crystal of about 18 millimeters in diameter and chemically etching the growth surface in Caro's acid ($5H_2SO_4$:$1H_2O_2$:$1H_2O$), wherein said step of liquid phase epitaxially growing a passivating window layer is comprised of epitaxially growing a lightly p-doped $Al_yGa_{1-y}As$ ($y \geqq 0.25$) passivating window layer on the growth surface of said GaAs seed crystal, and wherein said step of providing a window area is comprised of attaching a glass window support with the surface of said passivating window layer interfacing said glass window support and attaching thereto by using a molten glass bonded material;

removing said GaAs seed crystal completely by a chemical-mechanical means and preparing the exposed passivating window layer by polish etching the growth surface in $5H_2S_4$:$1H_2O_2$:$1H_2O$ etch prior to said step of growing said InGaAs photoemitting layer;

and wherein said step of supporting said photoemitting layer-passivating window layer composite is comprised of applying a contact ring on the outer periphery of the front of said InGaAs photoemitting layer to provide electrical contact for said photocathode structure.

* * * * *